(12) United States Patent
Burr et al.

(10) Patent No.: US 7,488,967 B2
(45) Date of Patent: Feb. 10, 2009

(54) STRUCTURE FOR CONFINING THE SWITCHING CURRENT IN PHASE MEMORY (PCM) CELLS

(75) Inventors: Geoffrey W. Burr, Cupertino, CA (US); Chung Hon Lam, Peekskill, NY (US); Simone Raoux, Santa Clara, CA (US); Stephen M. Rossnagel, Pleasantville, NY (US); Alejandro G. Schrott, New York, NY (US); Jonathan Z. Sun, Shrub Oak, NY (US); Hemantha K. Wickramasinghe, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 190 days.

(21) Appl. No.: 11/100,312

(22) Filed: Apr. 6, 2005

(65) Prior Publication Data

US 2006/0226409 A1  Oct. 12, 2006

(51) Int. Cl.
H01L 29/02  (2006.01)
(52) U.S. Cl. .................................. 257/2; 257/3; 257/4
(58) Field of Classification Search .................. 257/2, 257/3, 4, 209, 246, E31.029
See application file for complete search history.

(56) References Cited

U.S. PATENT DOCUMENTS

| | | | |
|---|---|---|---|
| 5,406,509 A * | 4/1995 | Ovshinsky et al. | 365/113 |
| 5,536,947 A * | 7/1996 | Klersy et al. | 257/3 |
| 6,204,139 B1 | 3/2001 | Liu et al. | |
| 6,673,691 B2 | 1/2004 | Zhuang et al. | |
| 6,867,425 B2 * | 3/2005 | Wicker | 257/3 |
| 7,045,383 B2 * | 5/2006 | Maimon et al. | 438/95 |
| 7,247,573 B2 * | 7/2007 | Spandre | 438/714 |
| 2003/0214856 A1 | 11/2003 | Pellizzer et al. | |
| 2003/0215978 A1 * | 11/2003 | Maimon et al. | 438/95 |
| 2003/0219924 A1 | 11/2003 | Bez et al. | |
| 2004/0036065 A1 | 2/2004 | Doan et al. | |
| 2004/0252544 A1 | 12/2004 | Lowery et al. | |
| 2005/0001284 A1 | 1/2005 | Pellizzer | |

OTHER PUBLICATIONS

U.S. Appl. No. 10/766,936, filed Jan. 30, 2004, Sun et al.
Ron Neale, "Amorphous Non-Volatile Memory: The Past and the Future", Electronic Engineering, Amorphous NV Memory, Apr. 2001, 10 pages total.

(Continued)

*Primary Examiner*—Steven Loke
*Assistant Examiner*—Thinh T Nguyen
(74) *Attorney, Agent, or Firm*—Gibb I.P. Law Firm, LLC

(57) ABSTRACT

Disclosed are a phase change memory cell and a method of forming the memory cell. The memory cell comprises a main body of phase change material connected directly to a bottom contact and via a narrow channel of phase change material to a top contact. The channel is tapered from the top contact towards the main body. A minimum width of the channel has a less than minimum lithographic dimension and is narrower than a width of the main body. Therefore, the channel provides a confined region for the switching current path and restricts phase changing to within the channel. In addition an embodiment of the memory cell isolates the main body of phase change material by providing a space between the phase change material and the cell walls. The space allows the phase change material to expand and contract and also limits heat dissipation.

6 Claims, 18 Drawing Sheets

OTHER PUBLICATIONS

Pirovano, et al., "Electronic Switching in Phase-Change Memories", IEEE Transactions on Electron Devices, vol. 51, No. 3, Mar. 2004, pp. 452-459.

Gill, et al., "Ovonic Unified Memory—A High-Performance Non-volatile Memory Technology for Stand-Alone Memory and Embedded Applications", 2002 IEEE International Solid-State Circuits Conference, Feb. 5, 2002, 10 pages total.

Stefan Lai, "Current Status of the Phase Change Memory and Its Future", 4 pages total.

Hwang, et al., "Full Integration and Reliability Evaluation of Phase-Change RAM Based on 0.24μm-CMOS Technologies", 2003 Symposium on VLSI Technology Digest of Technical Papers, 2 pages total.

Hwang, et al., "Writing Current Reduction for High-Density Phase-Change RAM", 2003 IEEE, 4 pages total.

Takaura, et al., "A GeSbTe Phase-Change Memory Cell Featuring a Tungsten Heater Electrode for Low-Power, Highly Stable, and Short-Read-Cycle Operations", 2003 IEEE, 4 pages total.

Yi, et al., "Novel Cell Structure of PRAM With Thin Metal Layer Inserted GeSbTe", 2003 IEEE, 4 pages total.

* cited by examiner

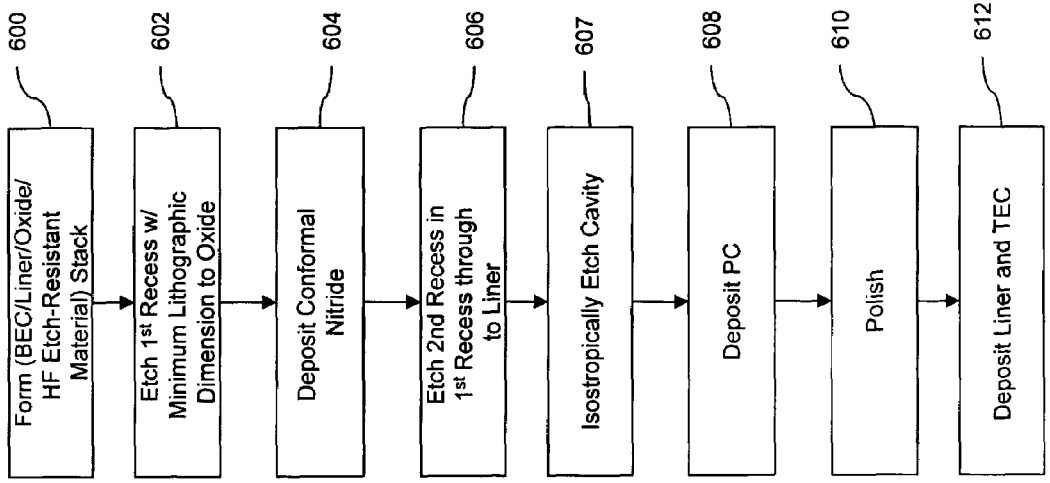
Figure 6
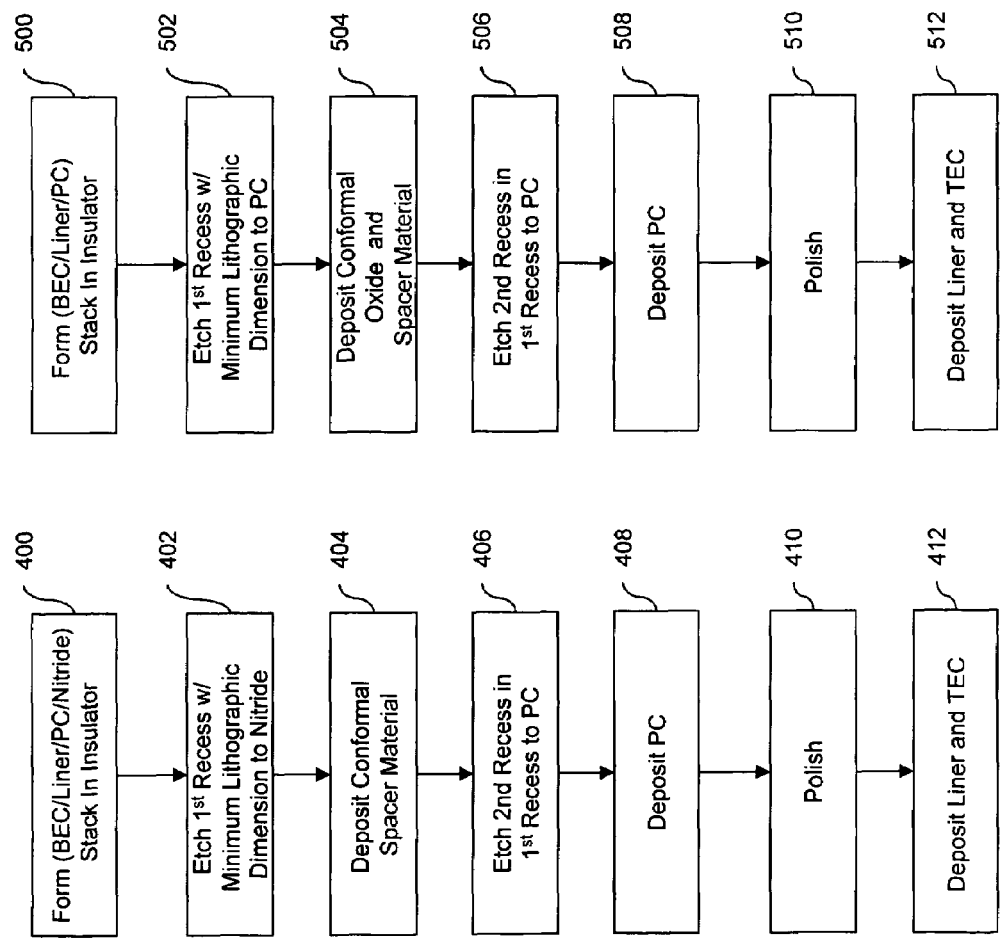
Figure 5
Figure 4

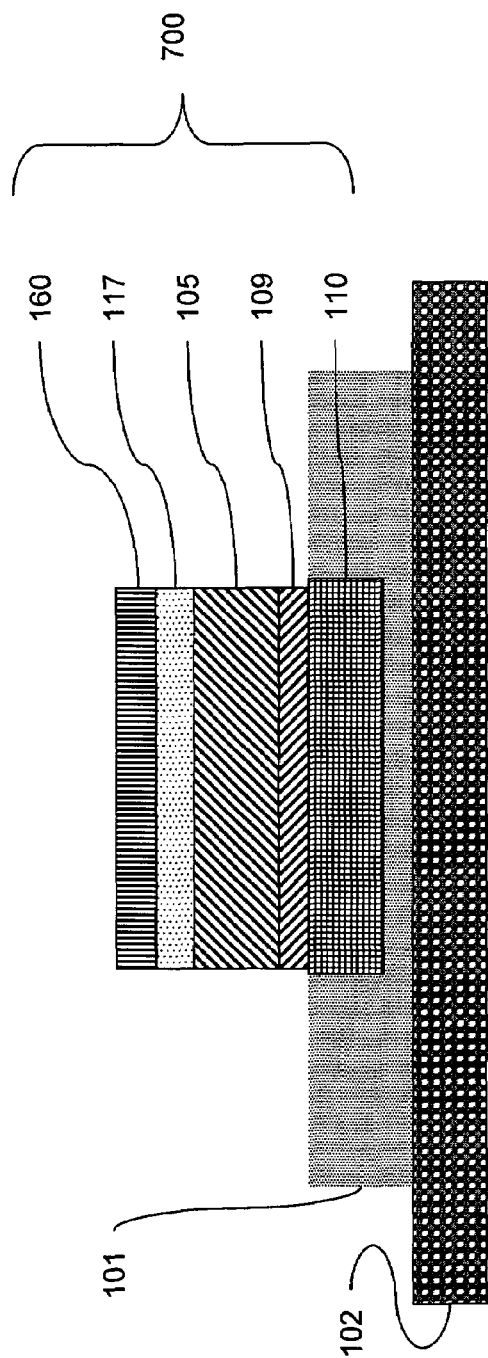
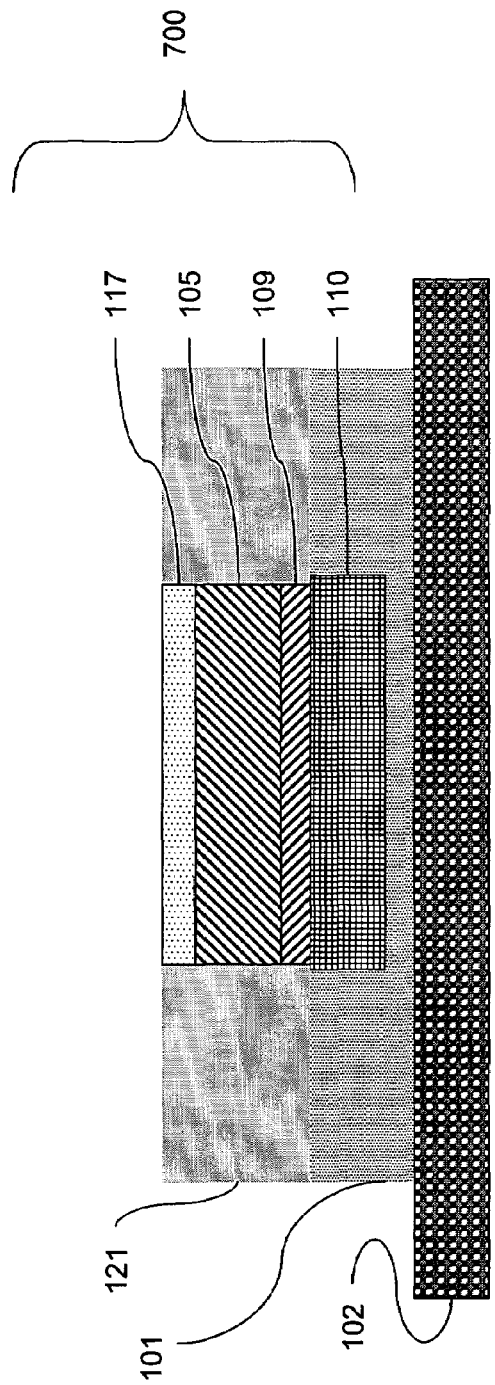

STRUCTURE FOR CONFINING THE SWITCHING CURRENT IN PHASE MEMORY (PCM) CELLS

BACKGROUND OF THE INVENTION

1. Field of the Invention

The present invention relates generally to a structure for a phase change memory cell and a method of manufacturing the phase change memory cell. More particularly, the present invention relates to a phase change memory cell structure, having a switching current path that is confined to a region smaller than the potentially switchable volume of the phase change material.

2. Description of the Related Art

Resistance switching materials (i.e., phase change materials), including but not limited to chalcogenides and alloys thereof, and perovskites or perovskite-like materials (e.g., colossal magnetoresistance (CMR) materials and high temperature superconductivity (HTSC) materials), can switch between an amorphous state, semi-amorphous or semi-crystalline states, and a crystalline state, depending upon the voltage of current passed through them. In their amorphous states, these phase change materials exhibit a higher resistance. In their crystalline states, resistance switching materials exhibit a lower resistance because electrons are able to move fast through the material. Electrical impulses applied to theses materials can "tune" or "program" them, such that they exhibit the desired resistive property. The following U.S. Patents and U.S. Patent Applications (incorporated herein by reference) discuss phase-change materials and methods for switching the resistances of such materials: U.S. Pat. No. 6,673,691 issued to Zhuang et al. on Jan. 6, 2004; U.S. Pat. No. 6,204,139 issued to Liu et al. on Mar. 20, 2001; and, U.S. Patent Application Pub. No. US 2004/0252544, Lowery et al., Dec. 16, 2004. Recently, the availability of binary chalcogenide alloys such as doped SbTe and ternary chalcogenide alloys such as those composed of Germanium, Antimony and Tellurium (e.g., $Ge_2Sb_2Te_5$ (GST)), as well as progress in lithographic and deposition techniques have provided new momentum towards the realization of practical phase change memory (PCM) cells for memory or storage applications, for example, as illustrated in the following documents (incorporated herein by reference): U.S. patent application Ser. No. 10/766,936, Sun et al., filed Jan. 30, 2004; "Electronic Switching in Phase-Change Memories", Pirovano et. al, IEEE Transactions on Electron Devices, Vol. 5, No. 3, pgs. 452-459, March 2004, "Amorphous non-volatile memory: the past and the future", Neale, Electronic Engineering, April 2001; "A GeSbTe Phase-Change Memory Cell Featuring a Tungsten Heater Electrode for Low Power, Highly Stable, and Short-Read-Cycle Operations", Takaura et al., 0-7803-7873-3/03© 2003 IEEE; U.S. Patent Application Pub. No. US 2004/0036065 A1, Doan et al., Feb. 26, 2004; and U.S. Patent Application Pub. No. US 2003/0219924 A1, Bez et al., Nov. 27, 2003. However, creating a phase change memory cell with power demands that are compatible with the current state-of-the-art integrated circuit design rules can be difficult.

SUMMARY OF THE INVENTION

This disclosure presents a phase change memory cell structure having a phase change material with a switching current path that is confined to a region smaller than the potentially switchable volume of the entire phase change material. The disclosure further presents a method of forming the phase change memory cell structure. The structure comprises a phase change memory cell having a main body of phase change material. The minimum width of the main body of phase change material is limited only by the minimum dimensions attainable using optical lithography techniques (i.e., minimum lithography dimensions). Additionally, the memory cell structure has a narrow channel of phase change material connecting to the top electrical contact. This narrow channel filled with phase change material provides a confined region for the switching current path. Thus, the phase change material in the main body of the cell does not switch in response to an applied current. In other words the main body of phase change material effectively becomes a non-switching portion of the phase change material. The phase change material in the narrow channel does switch in response to an applied current. In other words the narrow channel of phase change material becomes a switching portion of the phase change material. The width of the narrow channel is less than the width of the main body and, thereby, less than minimum lithographic dimensions. Lastly, an embodiment of the phase change memory cell structure further isolates the main body/non-switching portion of the phase change material by providing a space between the phase change material and the memory cell walls. The space may comprise, for example, a vacuum or a gas (e.g., a low pressure argon gas). The space allows for the expansion and contraction of the phase change material and limits heat dissipation from the phase change material.

In one embodiment, the phase change memory cell comprises an insulator on a silicon wafer. The insulator surrounds a phase change material. The phase change material comprises a main body of phase change material (i.e., a non-switching portion of the phase change material) in series with a narrow channel of phase change material (i.e., a switching portion of the phase change material). A first metal contact with a first liner (i.e., bottom electrical contact) is electrically connected to the non-switching portion and a second metal contact with a second liner (i.e., top electrical contact) is electrically connected to the switching portion. Sidewall spacers within the insulator delimit the narrow channel. The channel may be tapered towards the main body of phase change material such that the channel is wider near the top electrical contact than it is near the main body. A minimum width measurement of the main body of phase change material (i.e., non-switching portion) is limited only by minimum lithographic dimensions. A minimum width measurement of the narrow channel of phase change material (i.e., switching portion) is less than any width measurement of the non-switching portion. Specifically, the minimum width measurement of the switching portion comprises a less than current state-of-the-art minimum lithographic dimension. The sidewall spacers are formed of an insulating spacer material and comprise a nitride bottom surface that is positioned above the non-switching portion. The spacer may also comprise another nitride surface positioned laterally adjacent the insulator. The phase change material are preferably but not limited to (non-doped or doped) binary or ternary alloys formed by elements comprising germanium, antimony and tellurium, In another embodiment, the phase change memory cell also comprises a phase change material comprising a main body of phase change material (i.e., a non-switching portion of the phase change material) in series with a narrow channel filled with phase change material (i.e., switching portion of the phase change material). More particularly, the phase change memory cell comprises a first metal contact with a first liner (i.e., a bottom electrical contact) that contacts the main body of phase change material. An insulator layer is positioned adjacent the first liner and an etch-resistant layer is positioned adjacent the insulator layer. The etch-resistant layer (e.g., an HF etch-resistant metal) comprises a top surface and a bottom surface. The etch-resistant layer also has a narrow channel that is filled with the phase change material and extends from the top surface to the bottom surface. The first insulator layer has a cavity that extends between the bottom surface of the etch-resistant layer to the first liner layer. The narrow phase change material-filled channel opens into the cavity and the main body of phase change material is formed in the cavity. A second liner and second metal contact (e.g., top electrical contact) is positioned adjacent the switching portion of the phase change material in the narrow channel. A minimum width measurement of the narrow channel of phase change material (i.e., switching portion) is less than any width measurement of the main body of phase change material (i.e., non-switching portion). Specifically, the minimum width measurement of the channel comprises a less than current state-of-the-art minimum lithographic dimension. In this particular embodiment, the main body of the phase change material (i.e., non-switching portion) does not fill the entire cavity, but rather extends pyramid-like from the liner towards the narrow channel. Additionally, the narrow channel may be tapered towards the main body of phase change material such that the channel is wider near the top electrical contact than it is near the main body. Thus, a space (i.e., gap) remains around the non-switching portion. This space may be a vacuum space or a gas-filled space (e.g., a low-pressure argon-filled space). The space isolates the non-switching portion from the first insulator. The space allows the non-switching portion to expand and contract and limits heat dissipation.

One embodiment of a method of forming a phase change memory cell comprises forming a multi-layer stack disposed within an insulator. The stack should comprise a first metal contact layer, a first liner layer adjacent the first metal contact, a phase change material layer adjacent the first liner layer, and a nitride layer adjacent the phase-change material. Then, a first recess is etched through the insulator to the nitride layer. The first recess is etched by first depositing a photo-resist layer over the insulator. The photo-resist layer is lithographically patterned such that the first recess preferably has a width with the minimum lithographic dimension possible. Using the pattern, the first recess is etched and the photo-resist layer is removed. A spacer material layer (e.g., silicon oxide, silicon nitride, aluminum oxide, etc.) is deposited to form an approximately conformal layer over the insulator and on the nitride layer exposed in the first recess during the etching process. A second recess, having a minimum width with a less than minimum lithographic dimension, is then etched through the spacer material and the nitride layer in the first recess to expose the phase change material layer. The second recess is anisotropically etched through the spacer material layer and the nitride layer in the first recess, thereby, forming the second recess. The second recess may be tapered towards the main body of phase change material such that the resulting channel that is formed narrows towards the phase change material layer. Once the second recess is etched, an additional layer of the phase change material is deposited over the insulator and onto the spacer material layer and the first phase change material layer in the second recess. The additional phase change material layer is polished. Then, a second liner layer can be formed over the additional phase change material layer and finally a second metal contact layer can be formed on the second liner layer. The resulting structure comprises a narrow channel of phase change material in series with a wider main body of phase change material between two contacts. The density of current passing between the electrical contacts through the narrow channel is increased relative to the main body and thereby restricts the switching volume of the phase change material to within the narrow channel.

Another embodiment of a method of forming a phase change memory cell comprises forming multi-layer stack disposed within an insulator. The stack should comprise a first metal contact layer, a first liner layer adjacent the first metal contact layer, and a phase change material layer adjacent the first liner layer. A first recess is etched through the insulator to the phase change material layer. Etching the first recess is accomplished by depositing a photo-resist layer over the insulator. The photo-resist layer is lithographically patterned such that the first recess preferably has a width with the minimum lithographic dimension possible. After the first recess is etched, the photo-resist layer is removed. A nitride layer (e.g., an aluminum nitride layer, a silicon nitride layer, etc.) is deposited to form an approximately conformal nitride layer over the insulator and on the phase change material layer in the first recess. Then, a spacer material layer (e.g., silicon oxide, silicon nitride, aluminum oxide, etc.) is deposited to form an approximately conformal layer over the nitride layer. A second recess is anisotropically etched such that it has a minimum width with a less than minimum current state-of-the-are lithographic dimension. The second recess is etched through the spacer material layer and nitride layer in the first recess to expose the phase change material layer. The second recess may be tapered towards phase change material layer. An additional layer of the phase change material is deposited over the insulator and onto the spacer material and the phase change material layer in the second recess. The additional phase change material layer can be polished. Then, a second liner layer can be formed over the second phase change material layer and finally a second metal contact layer can be formed on the second liner layer. The resulting structure comprises a narrow channel of phase change material in series with a main body of phase change material. The density of current passing between the electrical contacts through the narrow channel is increased relative to the main body and thereby restricts the switching volume of the phase change material to within the narrow channel.

Another embodiment of a method of forming a phase change memory cell comprises forming a multi-layer stack on a silicon wafer. The multi-layer stack should comprise a first metal contact layer isolated from the silicon wafer by an insulator, a first liner layer adjacent the first metal contact layer, an oxide layer adjacent the first liner layer, and a hydrofluoric acid (or buffered hydrofluoric acid) etch-resistant layer adjacent the oxide layer. A first recess is etched through the hydrofluoric acid (HF) etch-resistant layer to the oxide layer. Etching the first recess is accomplished by first depositing a photo-resist layer on the HF etch-resistant layer. The photo-resist layer is lithographically patterned such that the first recess preferably has a width with the minimum lithographic dimension possible. The recess is etched and the photo-resist layer is removed. A nitride layer (e.g., a silicon nitride and an aluminum nitride) is deposited to form an approximately conformal layer over the HF etch-resistant layer and the oxide layer in the first recess. A second recess is directionally etched through the nitride layer in the first recess and through the oxide layer to expose the first liner layer such that the second recess has a width with a less than minimum lithographic dimension in the first direction. Then, the oxide walls of the second recess are isotropically etched from the second recess to form a cavity between the HF etch resistant layer and the first liner layer. Thus, the second recess becomes channel opening into the cavity and may be tapered as it nears the cavity. A phase change material layer is deposited into the channel and the cavity. A sputtering process is preferably used to deposit the phase change material such that such that a main body of the phase change material extends pyramid-like from the first liner layer to the narrow channel and a portion of the phase change material also fills the narrow channel. Any width measurement of the main body of phase change material in the cavity is greater than a minimum width measurement of the narrow channel filled with phase change material. Furthermore, a space remains in the cavity around the main body phase change material. This space isolates the phase change material from the oxide layer. Isolating the first phase change material allows it to expand and contract and also limits heat dissipation. After the phase change material layer is deposited, it is polished. Then, a second liner layer can be formed over the phase change material layer and finally a second metal contact layer can be formed on the second liner layer. The resulting structure comprises narrow channel of phase change material in series with a wider main body of phase change material. The density of current passing between the electrical contacts through the narrow channel is increased relative to the main body and thereby restricts the switching volume of the phase change material to within the narrow channel.

These, and other, aspects and objects of the present invention will be better appreciated and understood when considered in conjunction with the following description and the accompanying drawings. It should be understood, however, that the following description, while indicating embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which:

FIG. 4 is a schematic flow diagram illustrating a method of forming the structure 100 of the invention;

FIG. 5 is a schematic flow diagram illustrating another method of forming the structure 100 of the invention;

FIG. 6 is a schematic flow diagram illustrating a method of forming the structure 300 of the invention;

FIGS. 2-11 are schematic diagrams illustrating a partially completed structure 100 of the invention formed according to the method illustrated in the flow diagram of FIG. 4;

DETAILED DESCRIPTION OF PREFERRED EMBODIMENTS OF THE INVENTION

Figure 1:
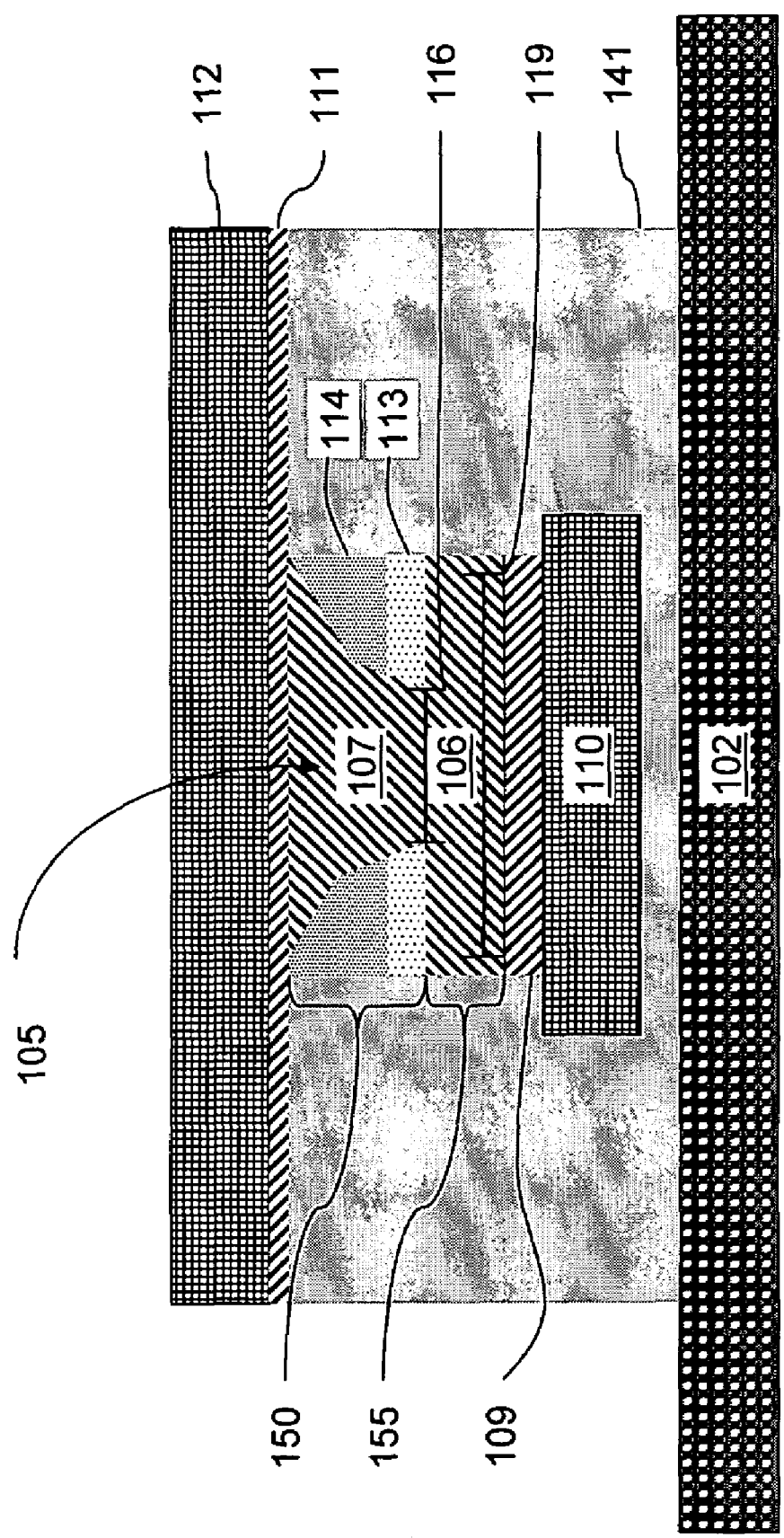
FIGS. 1 and 2 are schematic diagrams illustrating an embodiment of the structure 100 of the invention.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention. As discussed above, the availability of binary chalcogenide alloys such as doped SbTe and ternary chalcogenide alloys such as those composed by Germanium, Antimony and Tellurium (e.g., $Ge_2Sb_2Te_5$ (GST)), and progress in lithographic and deposition techniques have provided new momentum towards the realization of practical phase change memory (PCM) cells for memory or storage applications. However, creating a phase change memory cell with power demands that are compatible with modern integrated circuit design rules can be difficult. Phase change materials switch states in response to applied voltage pulses having a wide range of magnitudes and directions. State switching alters the resistivity of the phase change material and can also alter the overall volume of the phase change material causing stress to the cell structure. Specifically, the ratio of resistivities of a phase change material in the amorphous state over the crystalline state can be approximately five orders of magnitude. Therefore, a large current tends to run across the phase change memory cell as the material becomes crystalline and switching back to the amorphous state by a voltage pulse is costly in power. The cell switching dynamics would be greatly improved if the switching current path could be confined into a region of the phase change material in the cell that is smaller than the potentially switchable volume (i.e, the entire volume of the phase change material in the cell). Altering the dimensions of the phase change memory cell can alter the power demands of the cell and also the switching current path. For example, creating main body of a phase change memory cell, having a narrow width in a first direction, can reduce the power demands. Also, creating an even more narrow connection (e.g., bottleneck connection) between the main body of the memory cell and an electrical contact (e.g., top electrical contact) can increase the current density within the narrow region and thereby limit the switching current path (i.e., switching volume) to within that narrow region. A smaller switching volume is more easily reset and further reduces memory cell power demands. A wider non-switching volume in series with the switching volume is expected to remain in its crystalline form because of the temperatures reached during fabrication. Alternatively, it can be set crystalline by running a current pulse longer than that necessary to just switch the GST in the narrow region. Finally, isolating the phase change material in the main (non-switching) body of the memory cell from the walls of the memory cell (e.g., by providing a vacuum space or a gas-filled space) can reduce stress on the cell structure due to volume changes in the phase change material and can also limit heat dissipation that favors a remnant crystalline state in the isolated phase change material. The challenge is to reduce the dimensions of the phase change memory cell given the minimum dimensions attainable using current optical lithography techniques (i.e., minimum lithographic dimensions).

This disclosure presents a phase change memory cell structure having a phase change material with a switching current path that is confined to a region smaller than the potentially switchable volume of the entire phase change material in order to reduce the memory cell power demands. The disclosure further presents a method of forming the phase change memory cell structure. The structure comprises a phase change memory cell having a main body of phase change material. The minimum width of the main body is limited only by the minimum dimensions attainable using current state-of-the-art optical lithography techniques (i.e., minimum lithography dimensions). Additionally, the memory cell structure has a narrow phase-change material-filled channel that is in series with the main body of phase change material and connects to the top electrical contact. This narrow channel of phase change material provides a confined region for the switching current path. Thus, the phase change material in the main body of the cell does not switch in response to an applied current. In other words the main body of phase change material becomes a non-switching portion of the phase change material. The phase change material in the narrow channel does switch in response to an applied current. In other words the phase change material in the narrow channel becomes a switching portion of phase change material. The width of the channel is less than the width of the main body and, thereby, less than minimum lithographic dimensions. Lastly, an embodiment of the phase change memory cell structure further isolates the main body of the phase change material (i.e., the non-switching portion) by providing a space (e.g., a vacuum space or a low-pressure gas-filled space) between the phase change material and the memory cell walls. The space allows for the expansion and contraction of the phase change material and limits heat dissipation from the phase change material.

Figure 2:
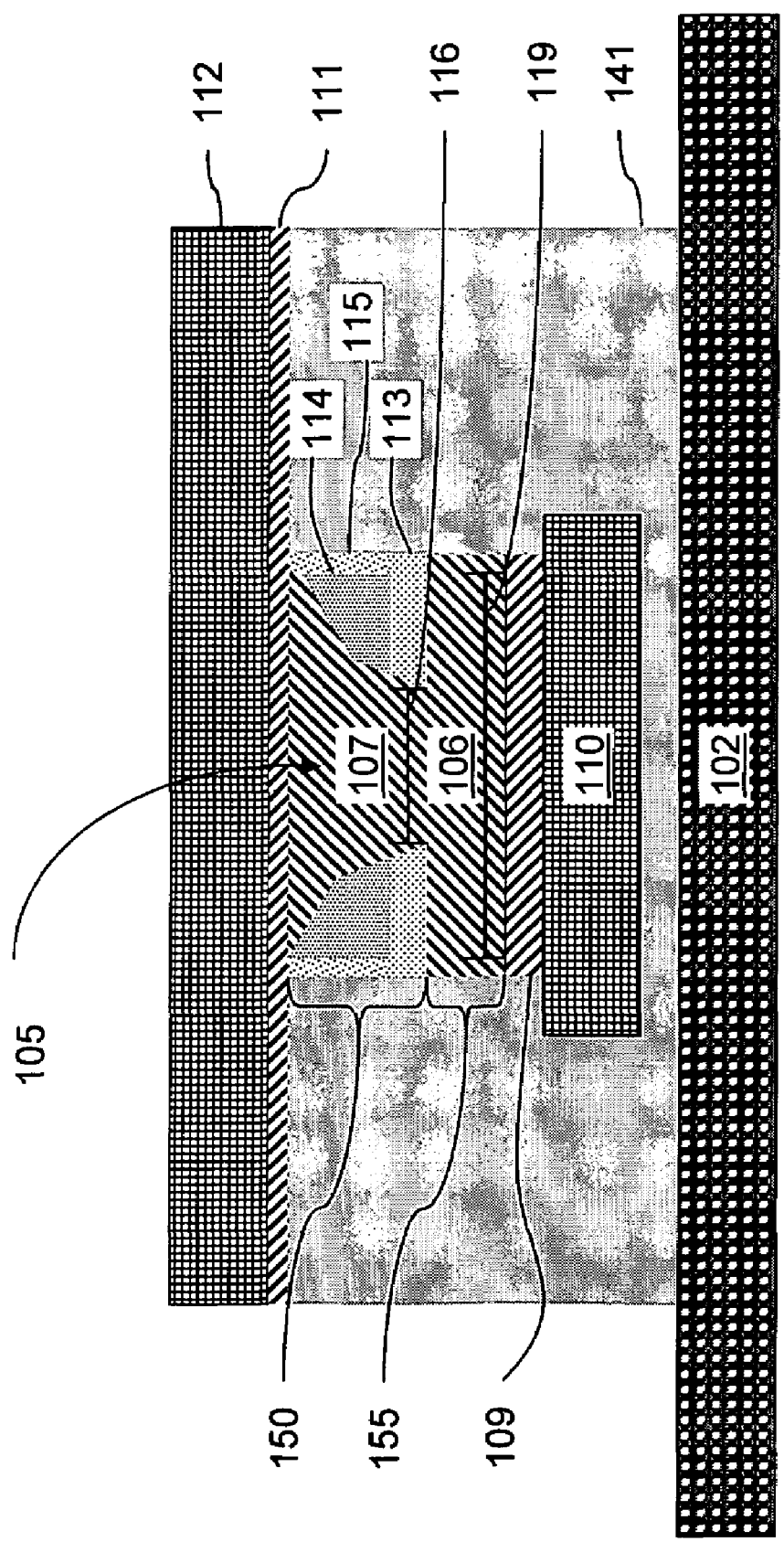

Referring to FIGS. 1 and 2, in one embodiment of the structure, the phase change memory cell 100 comprises a multi-layer insulator 141 (e.g., silicon dioxide) on a silicon wafer 102. The insulator 141 surrounds a phase change material 105 such as a chalcogenide ternary alloy made of germanium, antimony and tellurium ($Ge_2Sb_2Te_5$). The phase change material 105 comprises main body of the phase change material in series with another portion of the phase change material contained within a narrow channel 150. This narrow channel 150 of phase change material 105 provides a confined region for the switching current path and thereby restricts phase change material 105 switching to within the channel 150. Thus, the main body of phase change material does not switch in response to an applied current. In other words the main body of phase change material becomes a non-switching portion 106 of the phase change material 105. The phase change material in the narrow channel 150 does switch in response to an applied current. In other words the phase change material 105 in the narrow channel becomes a switching portion 107 of phase change material 105. A bottom electrical contact (i.e., a first metal contact 110) formed of a highly conductive metal such as copper and a first liner 109 (e.g., a liner made of tantalum nitride (TaN), titanium nitride (TiN), etc.) is electrically connected to the non-switching portion 106. A top electrical contact (i.e., a second metal contact 112) also formed of a highly conductive metal such as copper and a second liner 111 (e.g., a liner made of tantalum nitride (TaN), titanium nitride (TiN), etc.) is electrically connected to the switching portion 107 at the top of channel 150. Sidewall spacers 114 are formed of an insulating material (e.g., silicon dioxide, silicon nitride, aluminum nitride, etc.) and delineate the narrow channel 150 within the insulator 101. The channel 150 is narrow relative to the main body 155 containing the non-switching portion 106. The channel 150 may be tapered from the top electrical contact 112 towards the non-switching portion 106 such that the channel 150 is wider near the top electrical contact 112 than it is near the non-switching portion 106. A width measurement 119 of the non-switching portion 106 is limited only by minimum lithographic dimensions. A minimum width measurement 116 of the switching portion 107 is narrow relative to any width measurement 119 of the non-switching portion 106. Specifically, the width measurement 116 comprises a less than minimum lithographic dimension. The sidewall spacers 114 can further comprise a nitride bottom surface 113 that is positioned above the non-switching portion 106. Depending upon the method of forming the structure 100, sidewall spacers 114 can also comprises another nitride surface 115 positioned laterally adjacent the insulator 101 (as illustrated in FIG. 2). In an alternative embodiment, the thickness of the non-switching portion 106 could be made equal to zero, so that the switching portion contacts the first liner 109 directly.

Figure 3:
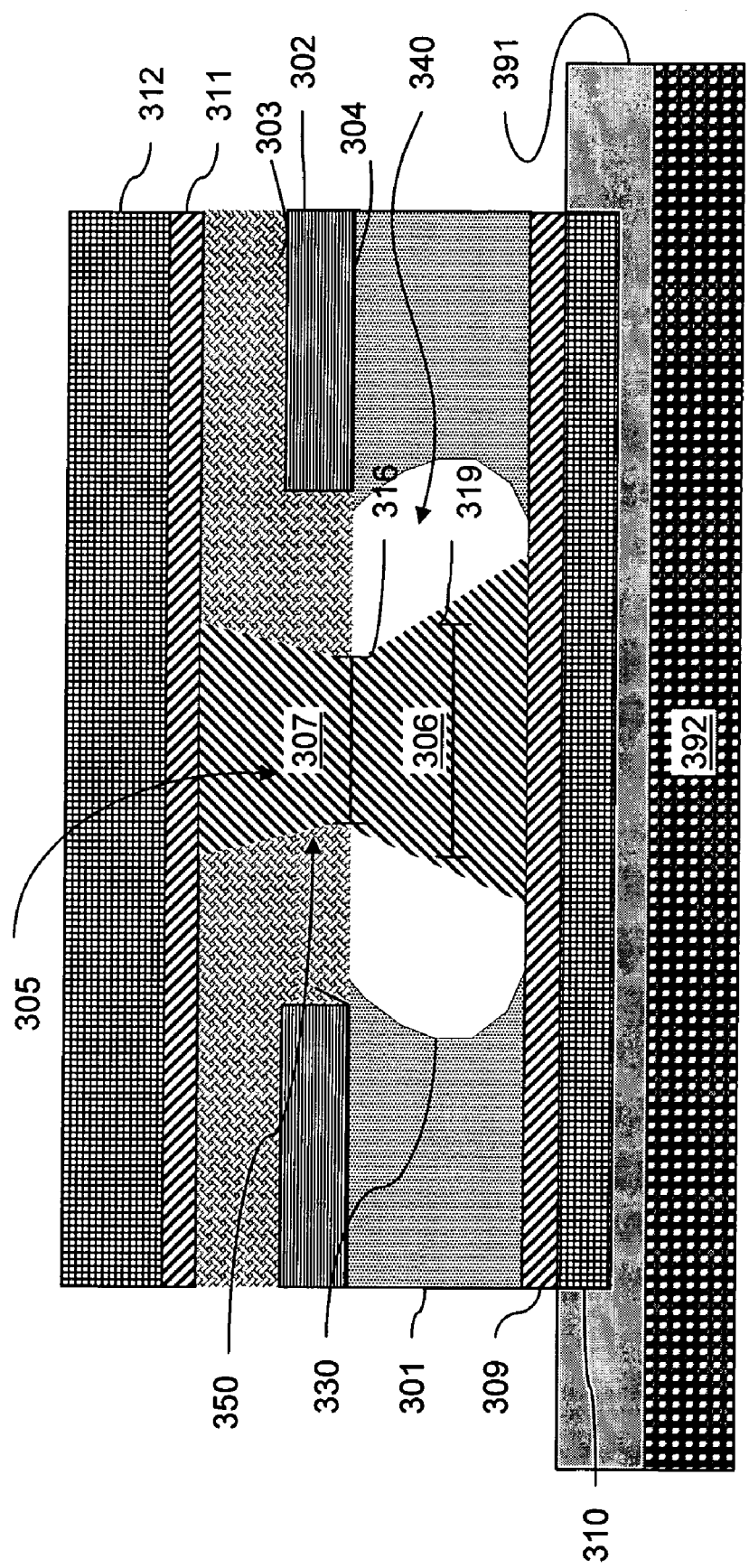
FIG. 3 is a schematic diagram illustrating another embodiment of the structure 300 of the invention.

Referring to FIG. 3, in another embodiment of the structure, the phase change memory cell 300 comprises a bottom electrical contact (i.e., first metal contact 310) made of a highly conductive metal such as copper formed in an insulator 391 on a silicon wafer 392 and lined with a first liner 309 (e.g., a liner made of tantalum nitride (TaN), titanium nitride (TiN), etc.). An insulator layer 301 (e.g., silicon dioxide layer) is positioned adjacent the first liner 309 and a etch-resistant layer 302 is positioned adjacent the insulator layer 301. The etch-resistant layer 302 comprises a top surface 303 and a bottom surface 304. The etch-resistant layer 302 further has a narrow channel 350 that extends from the top surface 303 to the bottom surface 304. The etch-resistant layer 302 is preferably formed of hydrofluoric acid (or buffered hydrofluoric acid) etch-resistant materials such as platinum (Pt) or Pt alloys, tungsten (W), or silicon nitride (SiN). Preferably, the region that is in contact with the GST 105 is made out of silicon nitride so that it minimizes lateral heat conduction out of the narrow channel region 350. The first insulator layer 301 has a cavity 330 that extends between the bottom surface 304 of the etch-resistant layer 302 to the first liner 309. The narrow channel 350 has a channel opening 351 that opens into the cavity 330. The cell 300 further comprises a phase change material 305 such as a chalcogenide ternary alloy formed of germanium, antimony and tellurium ($Ge_2Sb_2Te_5$). A main body of the phase change material 305 extends pyramid-like between the first liner 309 and the channel opening 351. Another portion of the phase change material 305 fills the narrow channel 350. This narrow channel 350 of phase change material 105 provides a confined region for the switching current path and thereby restricts phase change material 305 switching to within the channel 350. Thus, the main body of phase change material 305 does not switch in response to an applied current. In other words the main body of phase change material becomes a non-switching portion 306 of the phase change material 305. The phase change material in the narrow channel 150 does switch in response to an applied current. In other words the phase change material 305 in the narrow channel becomes a switching portion 307 of phase change material 305. A switching portion 307 of a phase change material 305 is disposed within the channel 350. The switching portion 307 contacts a top electrical contact. The top electrical contact can comprise a second liner 311 (e.g., a liner formed of tantalum nitride (TaN), titanium nitride (TiN), etc.) formed adjacent the switching portion 307 and a second metal (e.g., copper) contact 312 formed adjacent the second liner 311. A minimum width measurement 316 of the switching portion 307 is less than any width measurement 315 of the non-switching portion 306 of the phase change material 305. Specifically, the minimum width measurement 316 comprises a less than minimum lithographic dimension. The channel 350 may be tapered from the top electrical contact 312 towards the non-switching portion 306 such that the channel 350 is wider near the top electrical contact 312 than it is near the non-switching portion 306. Additionally, in this particular embodiment, the non-switching portion 306 does not fill the entire cavity 330, but rather extends pyramid-like from the first liner 309 towards the channel opening 351. A space 340 remains around the non-switching portion 306. This space 340 may be a vacuum space or a gas-filled space (e.g., a low-pressure argon-filled space). The space 340 isolates the non-switching portion 306 from the first insulator layer 301. The space 340 allows the non-switching portion 306 to expand and contract and also limits heat dissipation.

Figure 8:
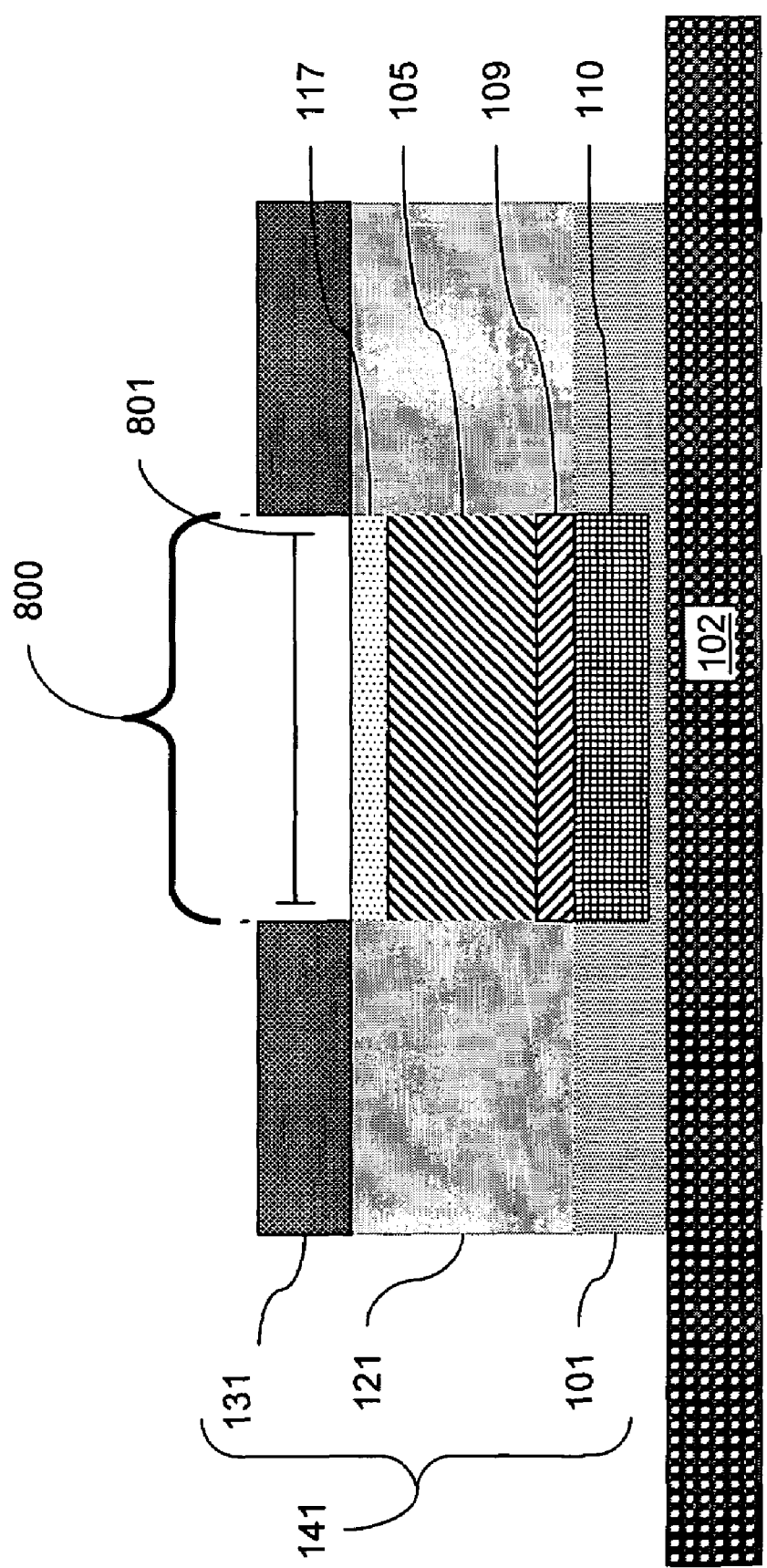
Figure 9:
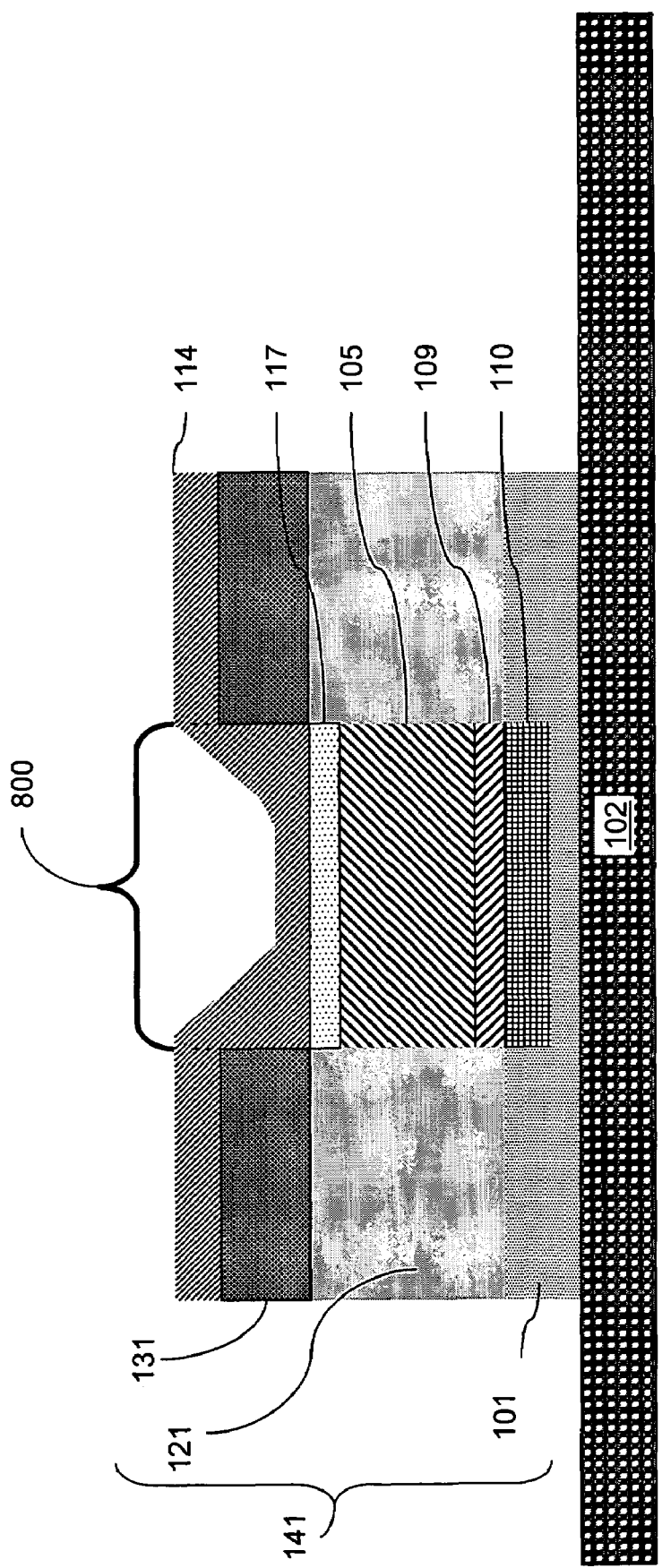
Figure 10:
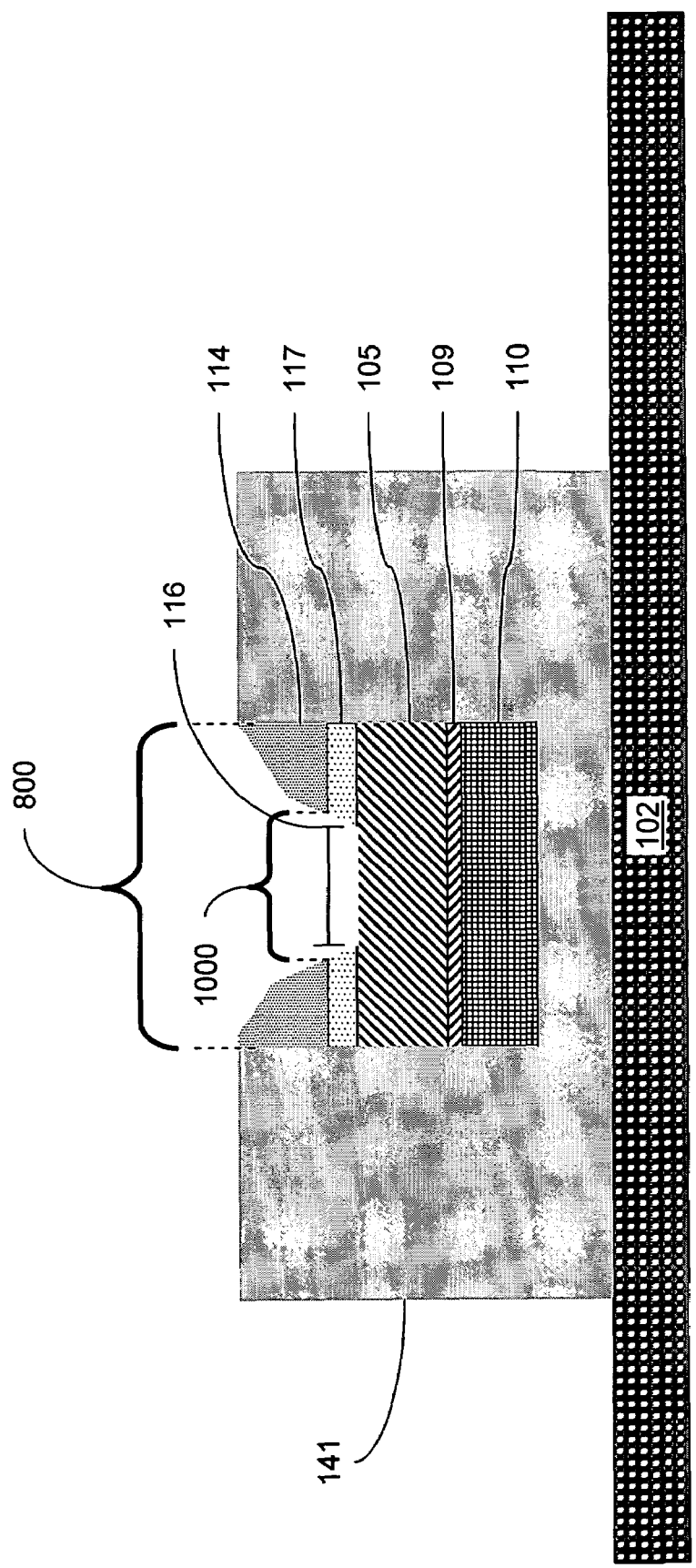
Figure 11:
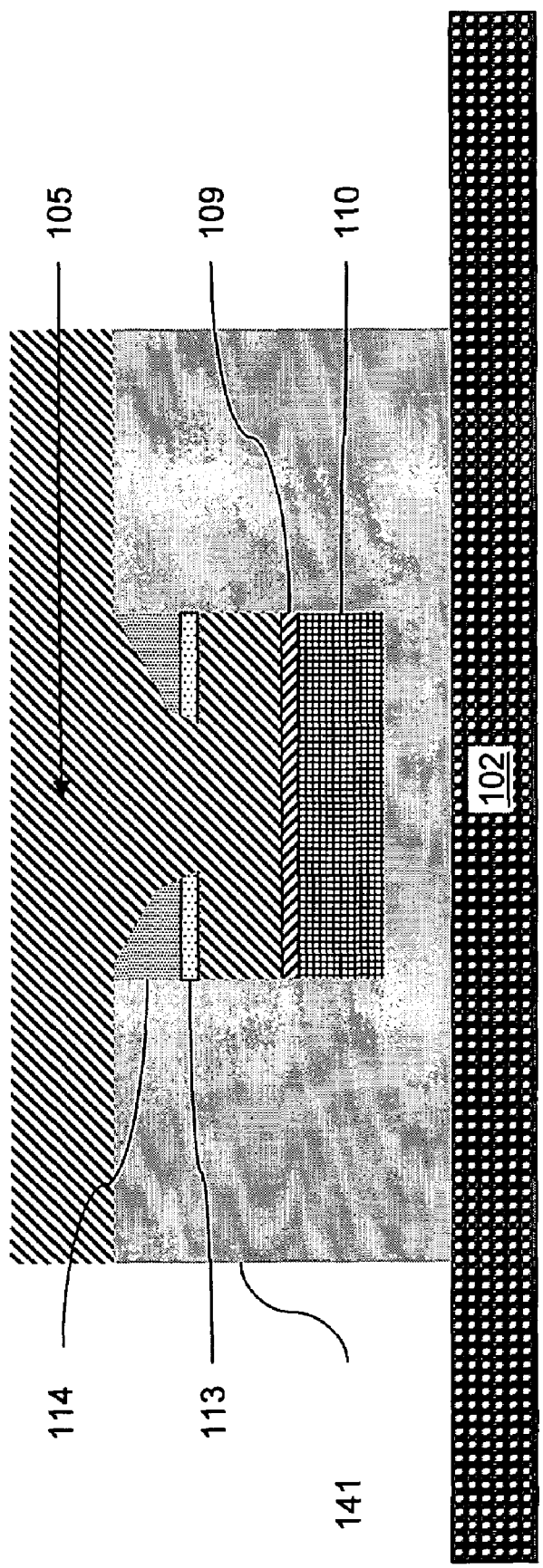

Referring to FIG. 4, one embodiment of a method of forming a phase change memory cell 100 of FIG. 1 comprises forming a first contact (BEC) 110, e.g. copper electrode, within a first insulator layer 101 (400, see FIG. 7). The method to form this BEC is well known to those skilled in the art. Next, the process continues by depositing a stack 700 formed with a first liner layer 109 (e.g., tantalum nitride (TaN) or titanium nitride (TiN) layer), a phase change material layer 105 (e.g., a chalcogenide ternary alloy comprising germanium, antimony and tellurium ($Ge_2Sb_2Te_5$)), and a nitride layer 117 (e.g., an N-block such as SiN or AlN). The stack 700 may also be formed with one or more additional layers including an aluminum layer 160. The aluminum layer 160, defined by lithography and lift-off, can constitute the hard mask used for patterning the nitride layer 117, and the liner 109-phase change material 105 portions of the stack using reactive ion etching (RIE). This patterning is etched preferably by first depositing a photo-resist layer over the Al layer 160. The photo-resist layer is lithographically patterned such that the pattern preferably, but not necessarily, has a width measurement with minimum lithographic dimension possible. Using the pattern, the stack is etched and the photo-resist layer is removed. Next, a second insulator layer 121 is formed to cover the patterned stack. The second insulator layer 121 is polished (e.g., by chemical mechanical polishing (CMP) so that the nitride layer 117 is uncovered. A third insulator layer 131 is deposited. A layered insulator 141 is formed by the first 101, second 121, and third 131 insulator layers. A first recess 800 is etched through the third insulator layer 131 of the insulator 141 to the nitride layer 117 (402; see FIG. 8). The first recess 800 is etched preferably by first depositing a photo-resist layer over the insulator 101. The photo-resist layer is lithographically patterned such that the first recess 800 preferably, but not necessarily, has a width measurement with minimum lithographic dimension possible (i.e., first recess width 801). Using the pattern, the first recess 800 is etched and the photo-resist layer is removed. A spacer material layer 114 (e.g., silicon oxide, silicon nitride or aluminum oxide) is deposited (404, see FIG. 9) to form an approximately conformal layer over the third insulator layer 131 and on the nitride layer 117 exposed in the first recess 800 during the etching process (402). The spacer material layer 114 is then polished, for example, by chemical mechanical polishing (CMP). A second recess 1000 having a minimum width measurement with a less than minimum lithographic dimension (i.e., minimum second recess width 116), is then etched through the spacer material 114 and the nitride layer 118 in the first recess 800 to expose the phase change material 105 (406, see FIG. 10). The second recess 1000 is anisotropically (i.e., directionally) etched through the spacer material layer 114 and the nitride layer 117 in the first recess 800, thereby, forming the second recess 1000 with the less than minimum lithographic dimension (i.e., minimum second recess width 116). The directional etching process may be accomplished, for example, by reactive ion etching (RIE) with chemistries tuned to stop at the phase change material layer 105. Once the second recess 1000 is etched (at process 406), an additional layer of the phase change material 105 is deposited over the insulator 101 and onto the spacer material layer 114 and the exposed phase change material layer 105 in the second recess 1000 (408, see FIG. 11). Thus, a narrow portion 107 of phase change material 105 is formed in series with a main body 106 of phase change material 105. The minimum width of the narrow portion 107 of phase change material 105 is equal to the minimum second recess width 116. The additional layer of phase change material layer 105 is polished (e.g., by chemical mechanical polishing (CMP) (410). Then, a second liner layer 111 can be formed over the narrow portion 107 of the phase change material layer 105 and finally a second metal contact layer 112 can be formed on the second liner layer 111 (412, see FIG. 1). The resulting structure comprises a narrow channel 150 filled with a narrow portion 107 of the phase change material 105 in series with a wider main body 106 of the phase change material 105 between two contacts 110, 112. The narrow channel 150 may be tapered as it nears the main body 106 of phase change material 105. The density of current passing between the electrical contacts 110, 112 through phase change material 107 in the narrow channel 150 is increased relative to the main body 106 of phase change material 105 and thereby restricts the switching volume of the phase change material 105 to the portion 107 within the narrow channel 150.

Figure 12:
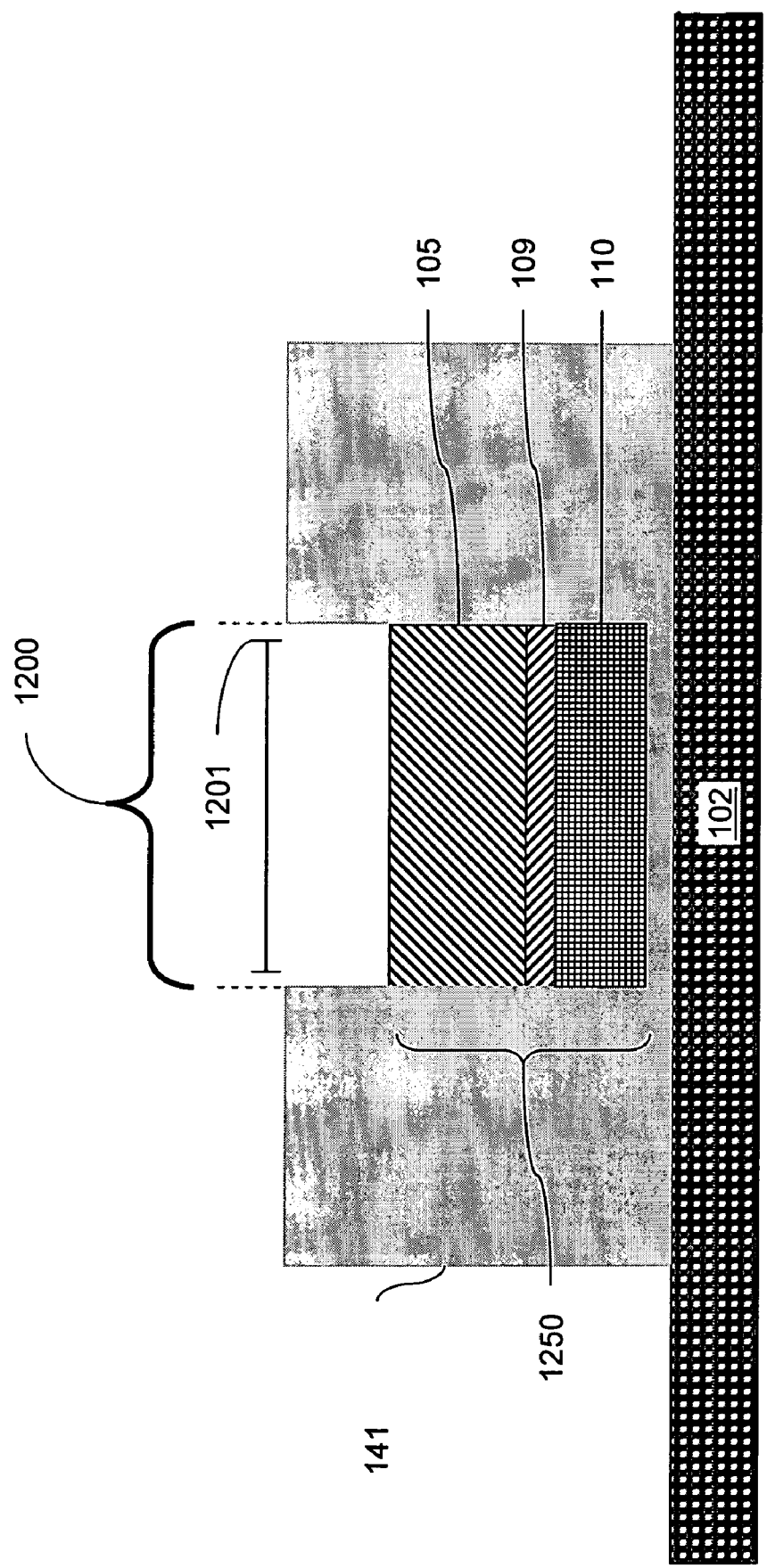
FIG. 12-15 are schematic diagrams illustrating a partially completed structure 100 of the invention formed according to the method illustrated in the flow diagram of FIG. 5.
Figure 13:
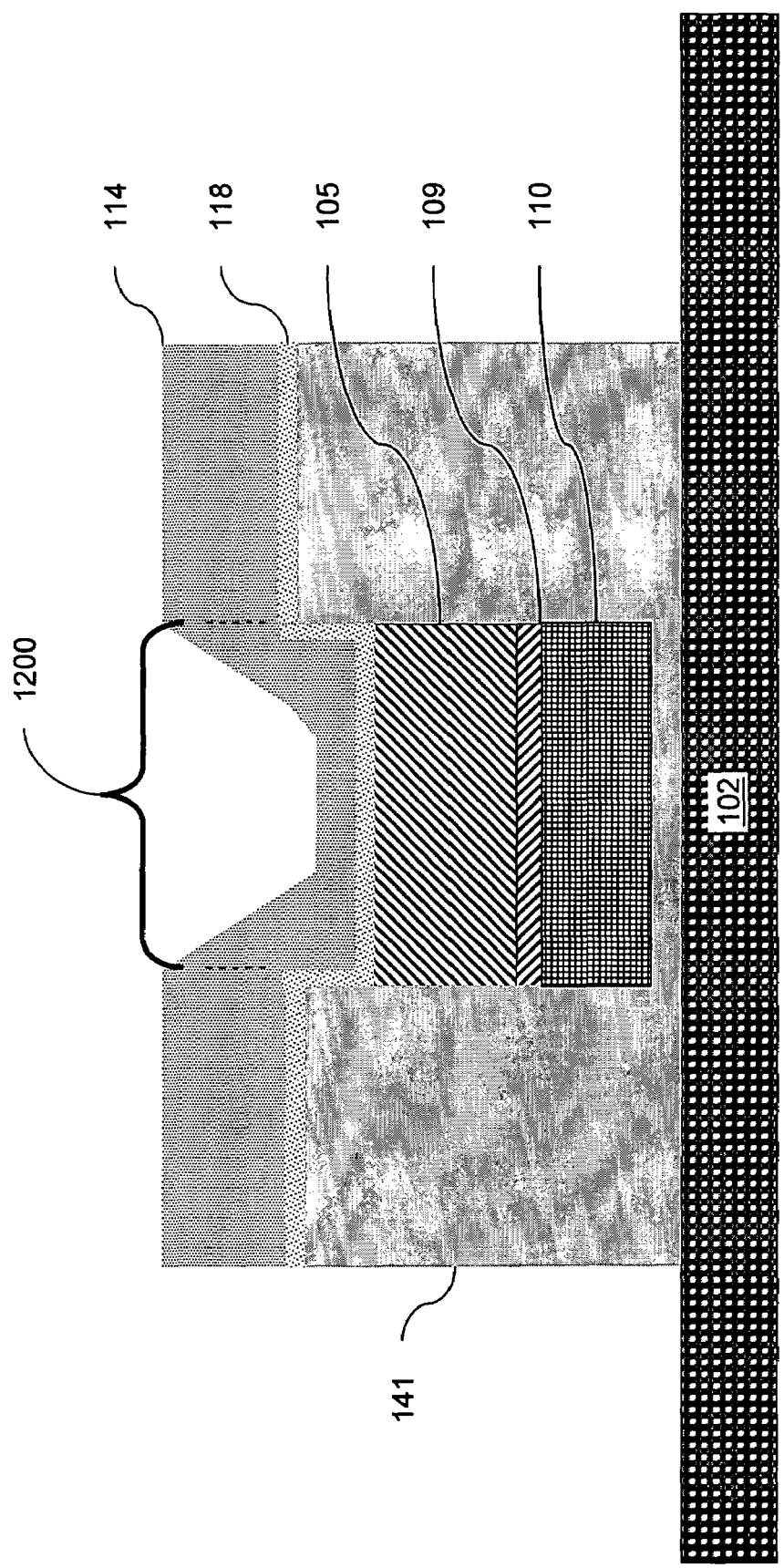
Figure 14:
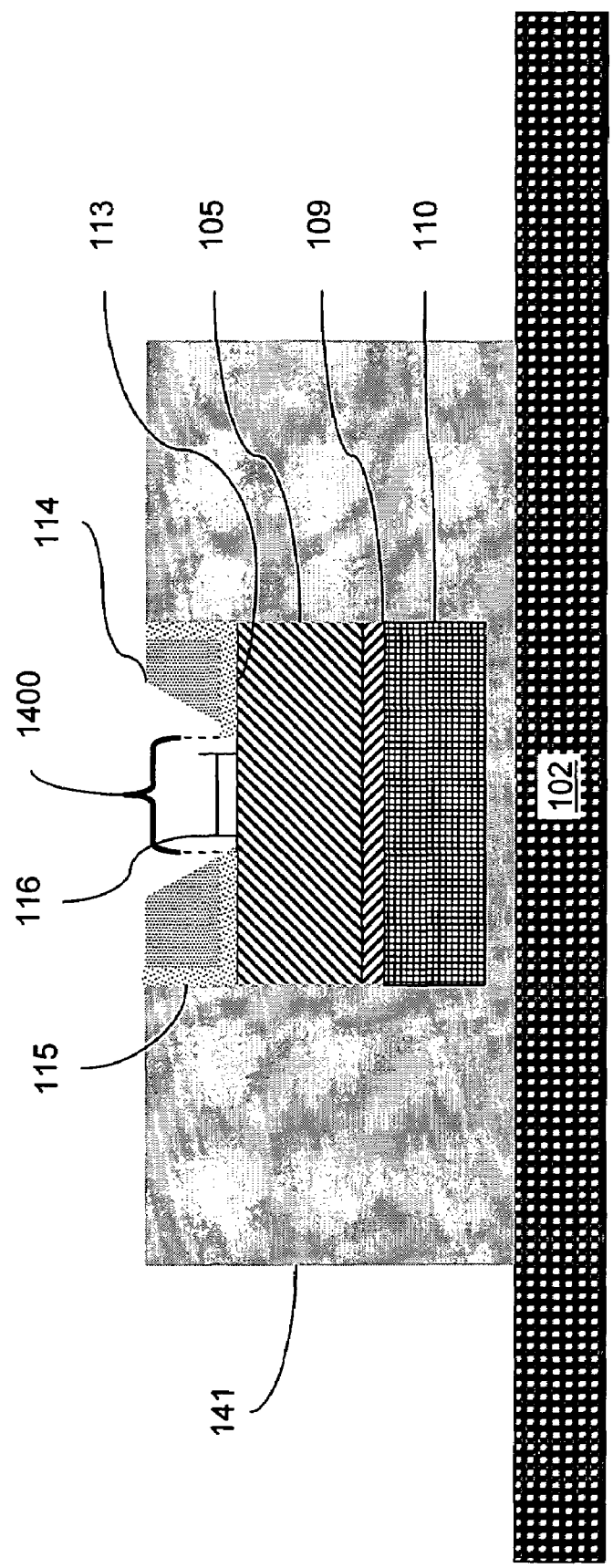
Figure 15:
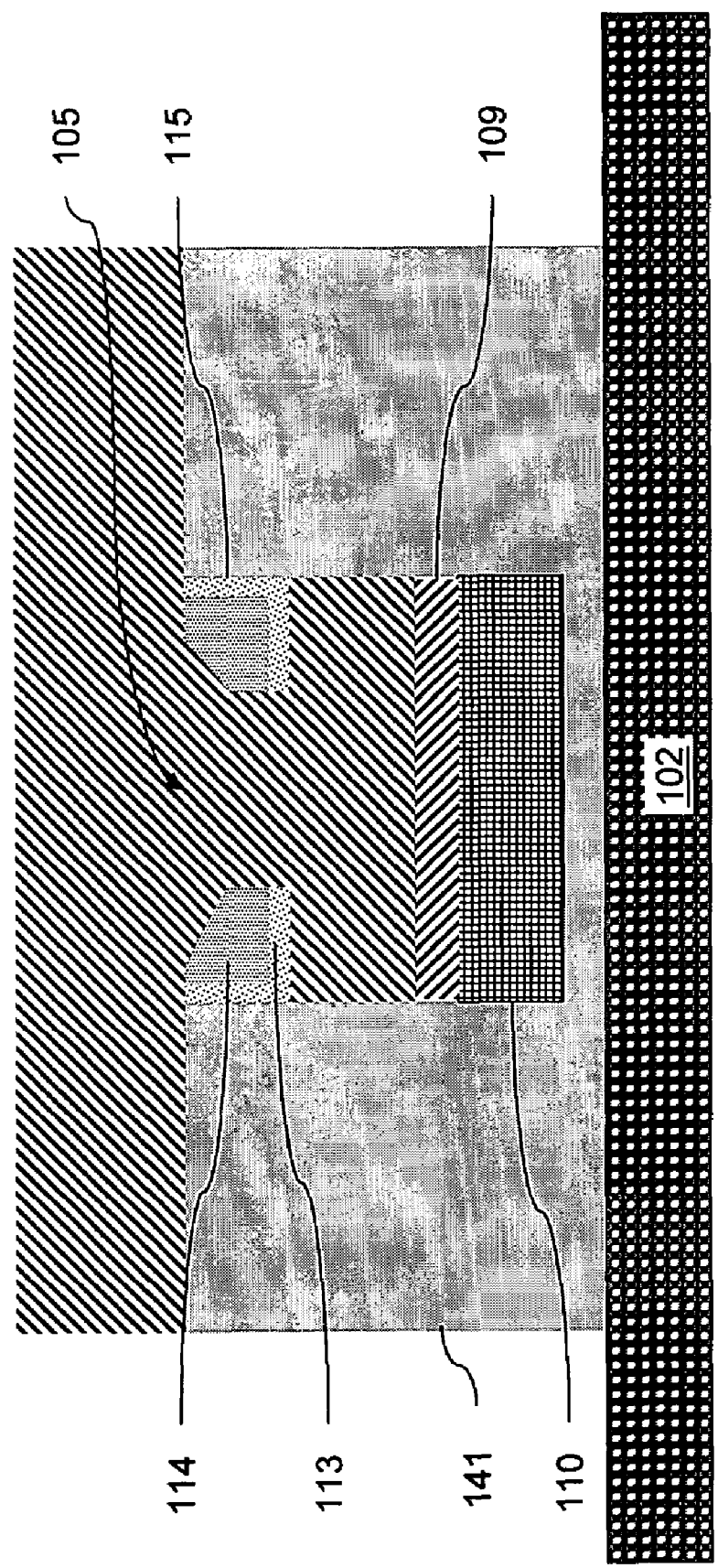

Referring to FIG. 5, another embodiment of a method of forming a phase change memory cell 100 of FIG. 2 comprises forming a first contact (BEC) 110, e.g. copper electrode, within a first insulator layer 101, as described above, and then forming a multi-layer stack 1250 disposed within a layered insulator 141(500, see FIG. 12. The layered insulator 141 comprises the first insulator layer 101, a second insulator layer 121 and a third insulator layer 131 and is formed in the manner described in FIG. 4 and FIG. 8). The stack 1250 should be formed with a first liner layer 109 (e.g., a liner layer formed of tantalum nitride (TaN), titanium nitride (TiN), etc.), a phase change material layer (GST) 105 (e.g., a chalcogenide ternary alloy comprising germanium, altimony and tellurium ($Ge_2Sb_2Te_5$)). A first recess 1200 is etched into the layered insulator 141 to expose the phase change material layer 105 (502). The etching process may be the same as that described in process 402 of FIG. 4 above. An oxide layer 118 having a low thermal conductivity is deposited to form an approximately conformal oxide layer 118 over the layered insulator 141 and on the GST 105 exposed in the first recess 1200 (504, see FIG. 13). Then, a spacer material layer 114 is deposited to form an approximately conformal layer over the oxide layer 118 (504, see FIG. 13). The material for the spacer material layer 114 is a material other than silicon oxide, such as silicon nitride and aluminum oxide, which are more chemically inert to the GST 105 than $SiO_2$, The purpose of the oxide layer 118 is to provide a layer with better heat insulating properties than the silicon nitride or aluminum nitride of the spacer material layer 114. A second recess 1400 is anisotropically etched such that it has a minimum second recess width 116 with a less than minimum lithographic dimension (506, see FIG. 14). The second recess 1400 is directionally etched through the spacer material layer 114 and oxide layer 118 in the first recess 1200 to expose the phase change material layer 105. The directional etching process may be accomplished, for example, by reactive ion etching (RIE) with chemistries tuned to stop at the phase change material layer 105. An additional layer of the phase change material layer 105 is deposited over the insulator 101 and onto the spacer material 114 and the first phase change material layer 106 exposed in the second recess 1400 (508, see FIG. 15). Thus, a narrow portion 107 of phase change material 105 is formed in series with a main body 106 of phase change material 105. The narrow portion 107 of phase change material 105 has a minimum width equal to the minimum second recess width 116.

The narrow portion 107 of phase change material 105 is polished (e.g., by chemical mechanical polishing (CMP) (510) stopping at the top of layered insulator 141. Then, a second liner layer 111 can be formed over the second phase change material layer 107 and finally a second metal contact layer 112 can be formed on the second liner layer 111 (512, see FIG. 2). The resulting structure 100 comprises a narrow channel 150 filled with a narrow portion 107 of phase change material 107 connecting to the second metal contact 150. The channel 105 may be tapered towards the main body 106 of phase change material such that it is wider near the second electrical contact 112 than it is near the main body 106. The narrow channel 150 may be tapered as it nears the main body 106 of phase change material 105. The density of current passing between the electrical contacts 110, 112 through phase change material 107 in the narrow channel 150 is increased relative to the main body 106 of phase change material 105 and thereby restricts the switching volume of the phase change material 105 to the portion 107 within the narrow channel 150.

Figure 16:
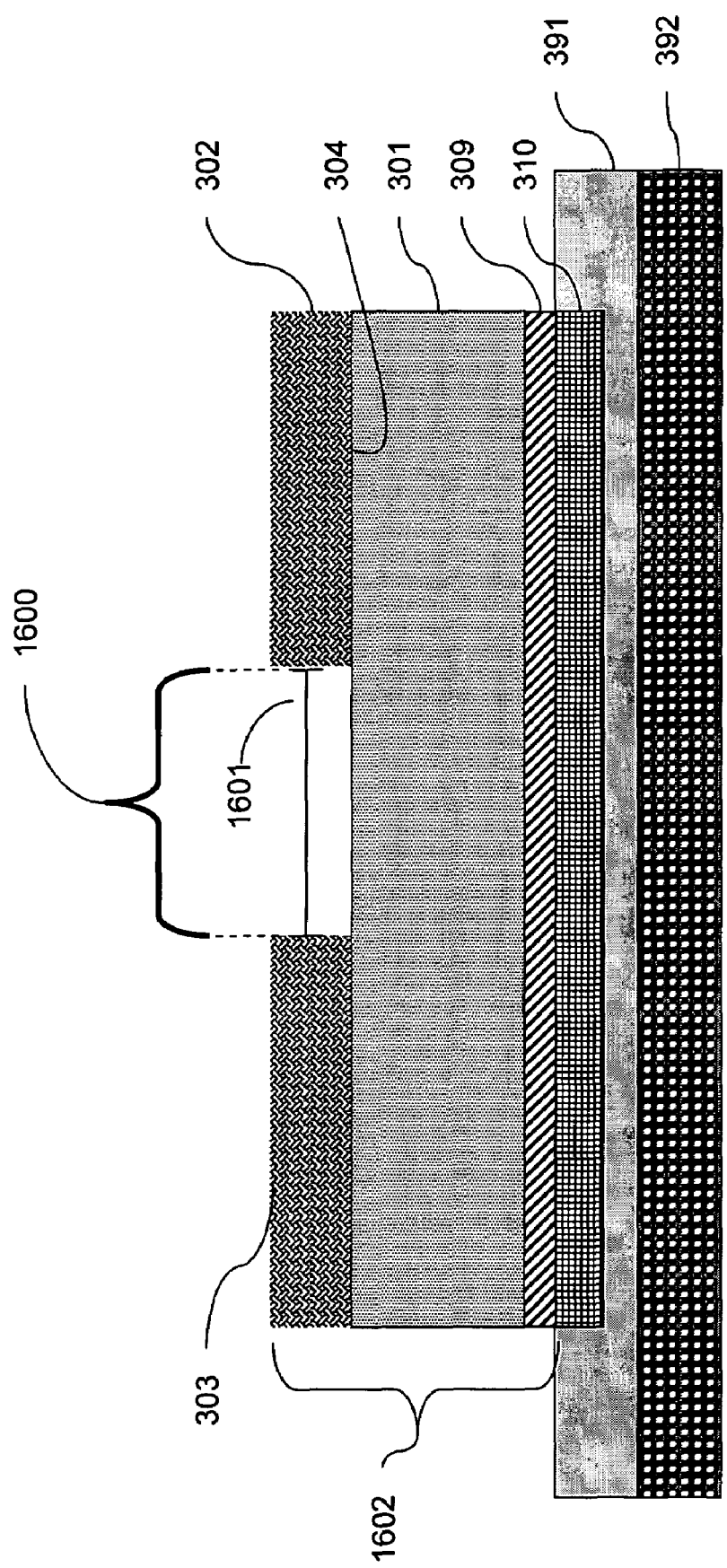
FIGS. 16-20 are schematic diagrams illustrating a partially completed structure 300 of the invention formed according to the method illustrated in the flow diagram of FIG. 6.
Figure 17:
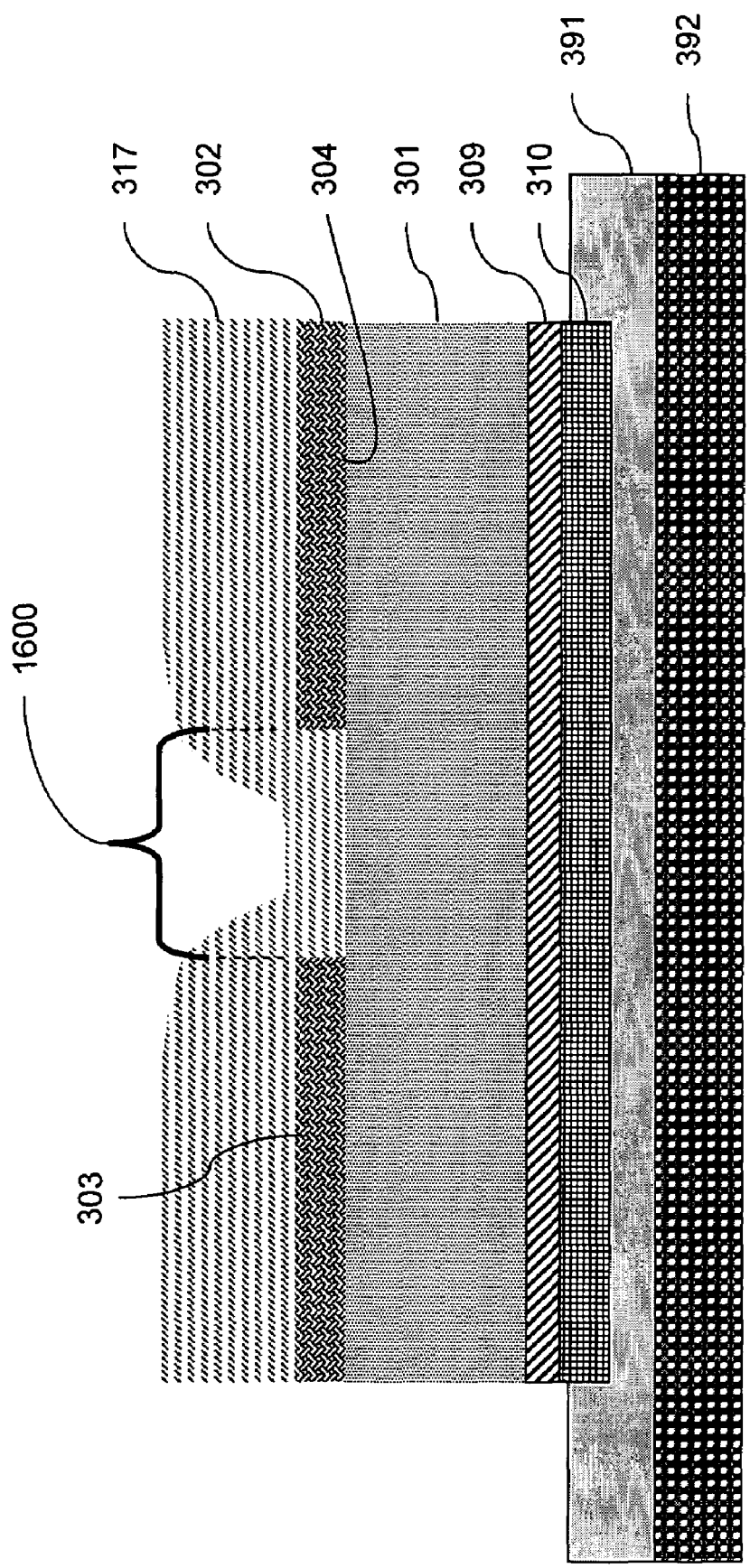
Figure 18:
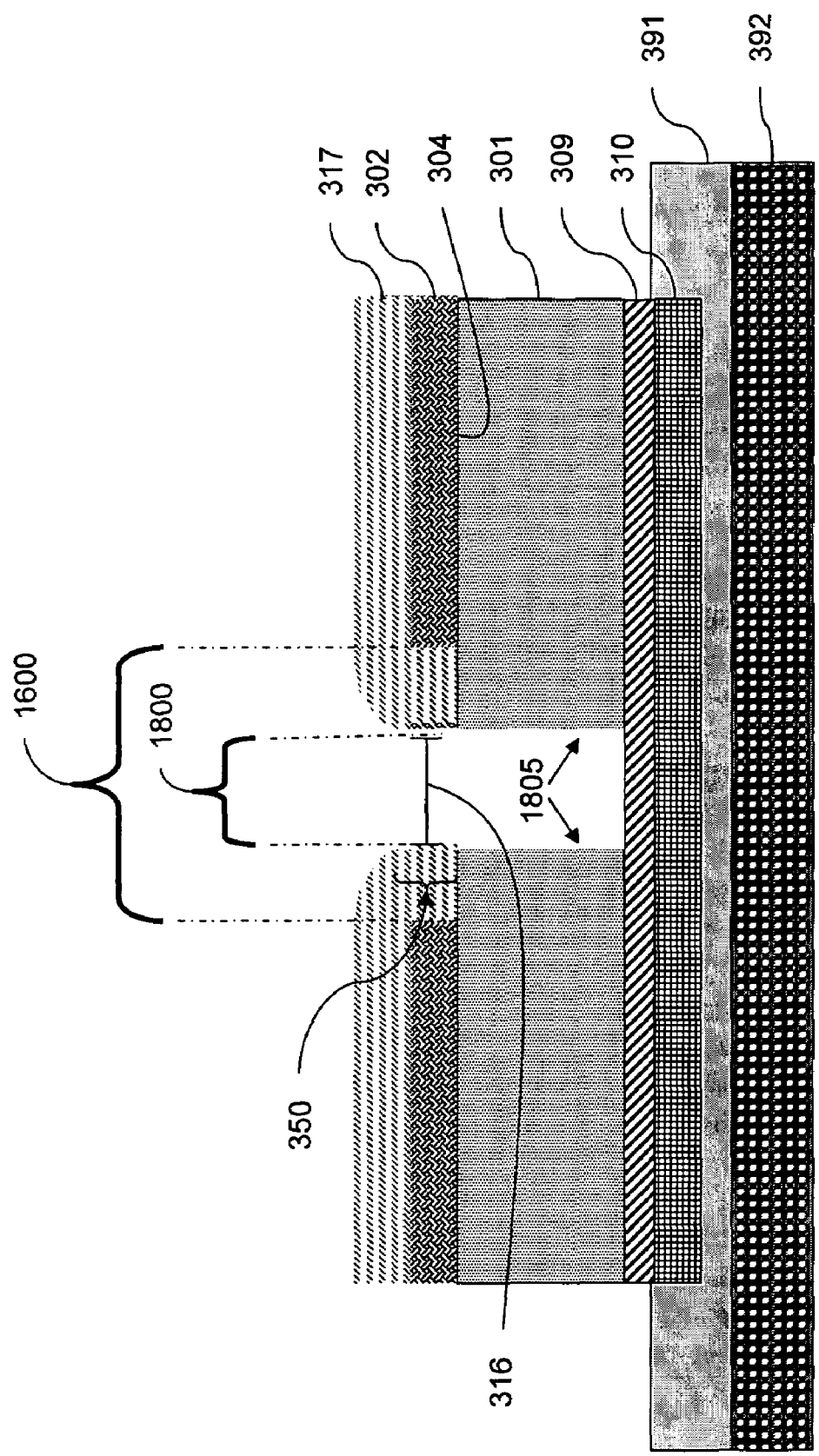
Figure 19:
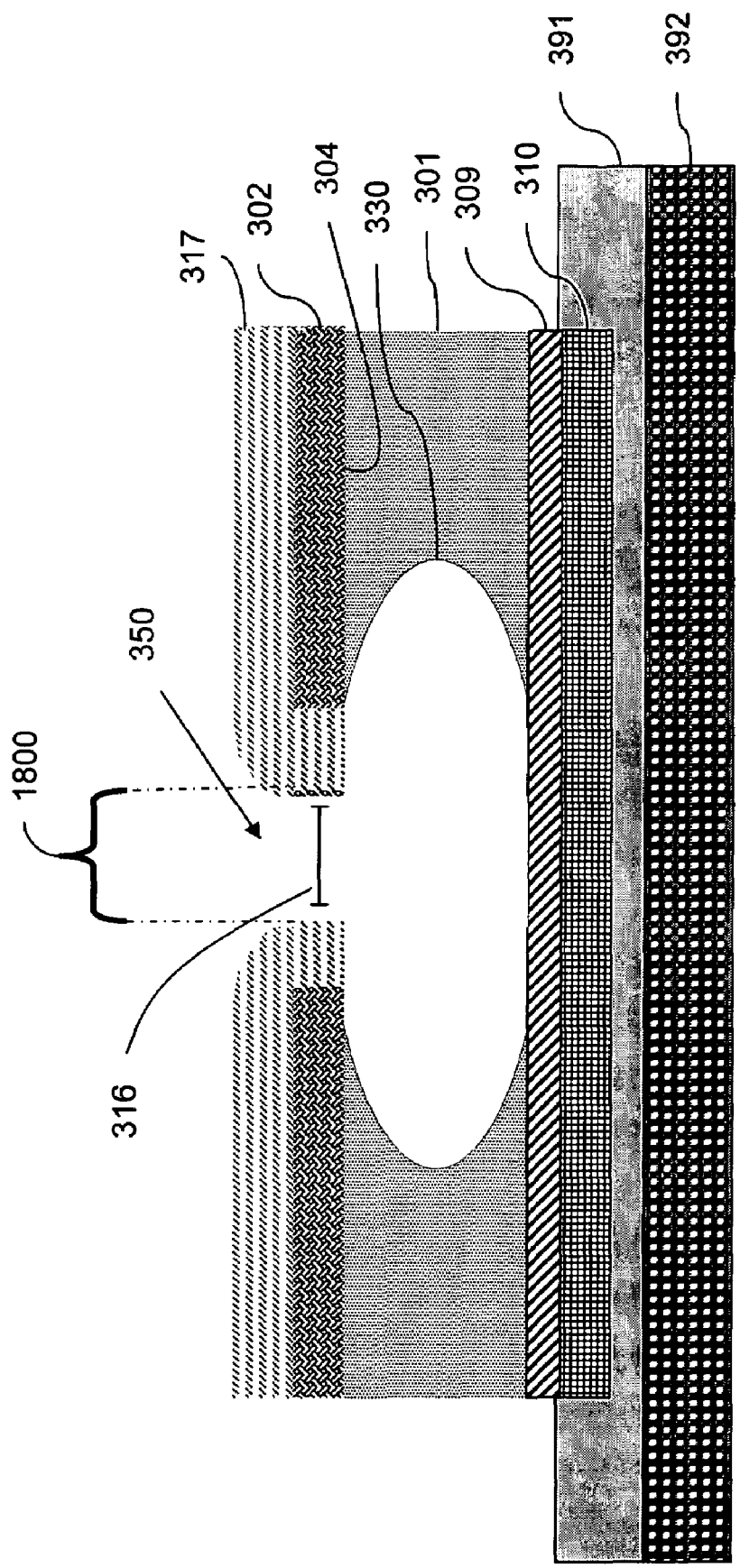
Figure 20:
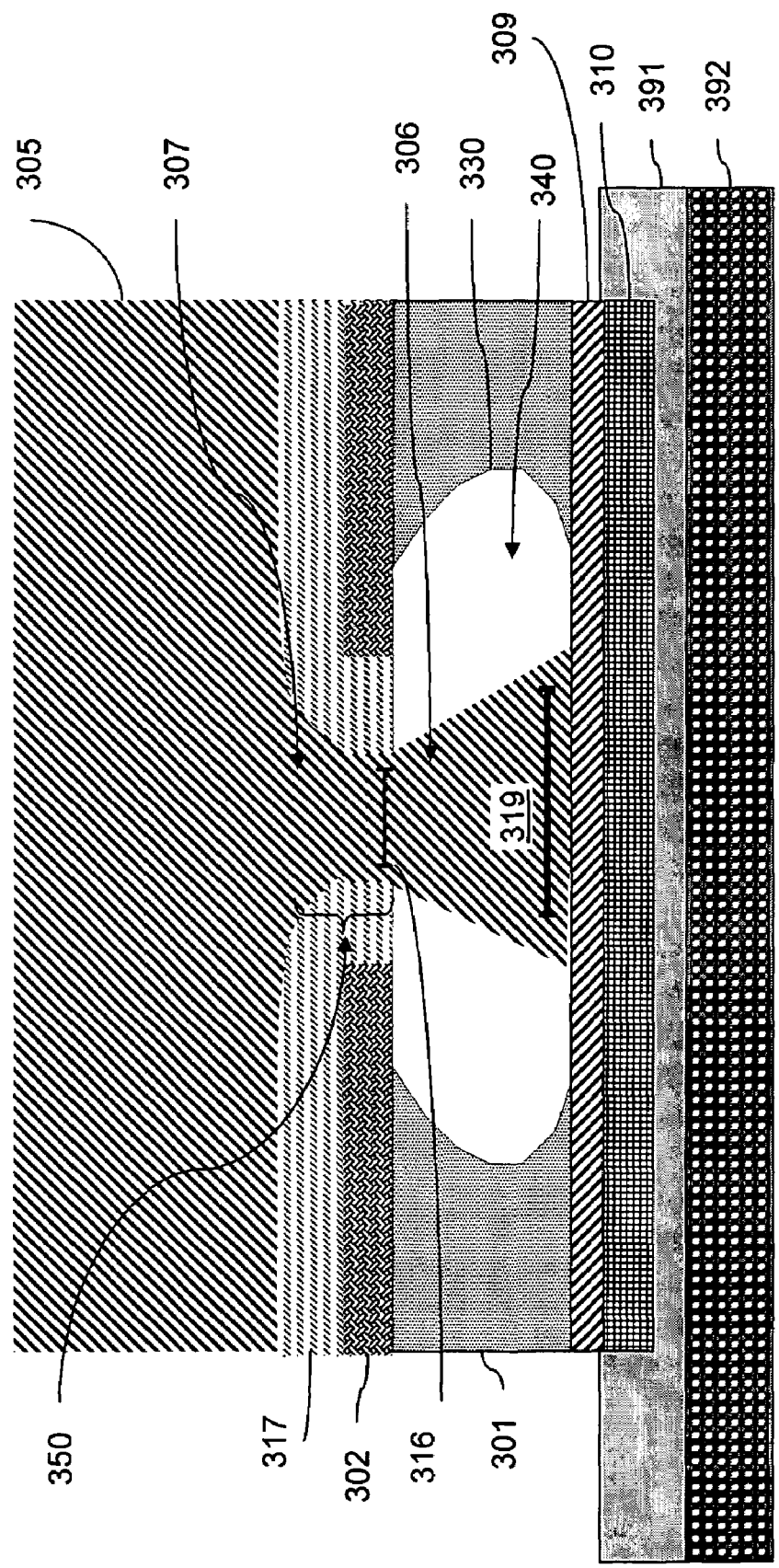

Referring to FIG. 6, another embodiment of a method of forming a phase change memory cell 300 comprises forming a first contact (BEC) 110, e.g. copper electrode, within a first insulator layer 391, as described above, on a silcon wafer 392 and then forming a multi-layer stack 1602 on the metal contact 110 (600, see FIG. 16). The multi-layer stack 1602 should comprise a first liner layer 309 (e.g., a liner layer of tantalum nitride (TaN), titanium nitride (TiN), etc.), an oxide layer 301 (e.g., a silicon dioxide layer), and a hydrofluoric acid (HF) etch-resistant metal layer 304. The HF etch-resistant layer 304 can be formed of a metal such as platinum (Pt), tantalum nitride (TaN), titanium nitride (TiN), silicon nitride (SiN) or aluminum nitride (AlN) and can comprise a bottom surface 304 and a top surface 303. A first recess 1600 is etched through the hydrofluoric acid (HF) etch-resistant layer 304 exposing the oxide layer 301 (602, see FIG. 16). Etching the first recess 1600 is accomplished by first depositing a photo-resist layer on the HF etch-resistant layer 304. The photo-resist layer is lithographically patterned such that the first recess 1600 preferably width (i.e., first recess width 1601) with the minimum lithographic dimension possible in a first direction. The first recess 1600 is etched and the photo-resist layer is removed. A nitride layer 317 (e.g., a silicon nitride and an aluminum nitride) is deposited to form an approximately conformal layer over the HF etch-resistant layer 304 and the oxide layer 301 exposed in the first recess 1600 (604, see FIG. 17). Note that the nitride layer 317 may comprise the same material as the HF etch-resistant layer 304. A second recess 1800 is anisotropically etched through the nitride layer 317 in the first recess 1600 and through the oxide layer 301 to expose the first liner layer 309 (606, see FIG. 18). The second recess 1800 is etched such that the second recess width 316 is less than minimum lithographic dimensions. Then, the oxide walls 1805 of the second recess 1800 are isotropically etched to form a cavity 330 between the HF etch resistant layer 304 and the first liner layer 309 (606, see FIG. 19). Thus, the second recess 1800 becomes a channel 350 to the cavity 330. The method process (606) of etching the cavity can be accomplished by performing an isotropic wet etch, for example, by using a buffer HF solution that is highly selective for silicon oxide over silicon nitride. An exemplary wet etch process for forming a cavity 330 is illustrated in U.S. patent application Ser. No. 10/766,936, cited above and incorporated herein by reference. A phase change material layer 305 is deposited into the channel 350 and the cavity 330 (608, see FIG. 20). A sputtering process is preferably used to deposit the phase change material 305 such that such that a main body 306 of the phase change material 305 extends from the first liner layer 309 to the channel 350 and a narrow portion 307 of the phase change material 305 fills the channel 350. Thus, a narrow channel 350 filled with a portion 307 of the phase change material 305 is formed in series with a main body 306 of phase change material 305. The minimum width 316 of the channel 350 is less than any width 319 of the main body 306 of phase change material 305. The narrow channel 350 may be tapered towards the main body 306 of phase change material 305 with the narrowest width 316 of the narrow portion 307 being adjacent the main body 306. Furthermore, a space 340 remains in the cavity 330 around the first phase change material portion 306. This space 340 isolates the first phase change material portion 306 from the oxide layer 301. A vacuum may be created in this space or the space may be filled with a gas (e.g., a low-pressure argon). After the phase change material layer 305 is deposited, it is polished (610). Then, a second liner layer 311 can be formed over the phase change material layer 305 and finally a second metal contact layer 312 can be formed on the second liner layer 311 (612, see FIG. 3). The resulting structure 300 comprises a narrow channel 350 of phase change material connecting to the second metal contact 312. The density of current passing between the electrical contacts 310, 312 through the phase change material 307 in the narrow channel 150 is increased relative to the main body 306 of phase change material 305 and thereby restricts the switching volume of the phase change material 305 to the portion 307 within the narrow channel 350.

Therefore, disclosed are a phase change memory cell structure, having a switchable current path that is confined to a narrow channel in order to reduce cell power demands, and a method of forming the phase change memory cell structure. The structure comprises a phase change memory cell with a main body of phase change material (i.e., non-switching portion) connected at one end directly to a bottom electrical contact and via a narrow channel of phase change material (i.e., switching portion) at another end to a top electrical contact. The minimum width of the main body is limited only by the minimum dimensions attainable using current state-of-the-art optical lithography techniques. The width of the channel containing the phase change material is formed with less than minimum lithographic dimensions and is narrower than the main body of phase change material. The channel, therefore, provides a confined region for the switching current path and restricts phase changing (i.e., resistance switching) to within the channel. In addition, an embodiment of the phase change memory cell structure isolates the main body of phase change material by providing a space between the phase change material and the cell walls. The space allows the phase change material to expand and contract and also limits heat dissipation. While the invention has been described in terms of embodiments, those skilled in the art will recognize that the invention can be practiced with modification within the spirit and scope of the appended claims.

What is claimed is:

1. A phase change memory cell comprising:
   a wafer;
   an insulator on said wafer;
   a first contact in said insulator;
   a second contact above said first contact on said insulator;
   a phase change material within said insulator and comprising a main body adjacent to said first contact and a channel adjacent to said second contact and separated from said first contact by said main body; and
   sidewall spacers within said insulator adjacent to said channel, wherein said sidewall spacers have curved edges and delimit said channel such that said channel is tapered from said second contact to said main body and such that said channel comprises a narrow portion immediately adjacent to said main body and confining resistance switching of said phase change material to said channel above said main body, wherein a width measurement of said narrow portion is narrow relative to a width measurement of said main body.

2. The phase change memory cell of claim 1, wherein said narrow portion of said channel increases a density of an applied current passing through said phase change material and thereby restricts said resistance switching to within said narrow portion.

3. The phase change memory cell of claim 1, wherein said first contact is electrically connected to said main body, wherein said second contact is electrically connected to said channel, and wherein said first contact and said second contact are adapted to pass said applied electric current through said phase change material in order to trigger resistance switching of said phase change material.

4. The phase change memory cell of claim 1, wherein said width measurements of said main body is limited by a minimum width attainable using current state-of-the-art optical lithography and wherein said width measurement of said narrow portion is less than said minimum width attainable using optical lithography.

5. The phase change memory cell of claim 1, wherein said phase change material comprises a binary alloy comprising two of germanium, antimony and tellurium.

6. The phase change memory cell of claim 1, wherein said phase change material comprises a ternary alloy comprising germanium, antimony and tellurium.

* * * * *